United States Patent [19]

Goldsmith et al.

[11] Patent Number: 5,479,539
[45] Date of Patent: Dec. 26, 1995

[54] INTEGRATED OPTICAL TRANSMITTER AND RECEIVER

[75] Inventors: Charles L. Goldsmith, Plano; Bradley M. Kanack, DeSoto, both of Tex.

[73] Assignee: Texas Instruments Incorporated, Dallas, Tex.

[21] Appl. No.: 259,816

[22] Filed: Jun. 15, 1994

[51] Int. Cl.[6] ............................................ G02B 6/12
[52] U.S. Cl. ........................... 385/14; 359/152; 359/173; 385/1; 385/24
[58] Field of Search ..................... 385/1–3, 14, 24; 359/152, 154, 164, 173; 372/50

[56] References Cited

U.S. PATENT DOCUMENTS

| 4,021,834 | 5/1977 | Epstein et al. | 385/14 X |
| 4,346,478 | 8/1982 | Sichling | 359/173 X |
| 4,573,215 | 2/1986 | Oates et al. | 385/24 X |
| 4,677,740 | 7/1987 | Shifrin et al. | 437/3 |
| 5,031,188 | 7/1991 | Koch et al. | 372/50 |
| 5,262,656 | 11/1993 | Blondeau et al. | 385/14 X |
| 5,347,601 | 9/1994 | Ade et al. | 385/3 |

*Primary Examiner*—John D. Lee
*Attorney, Agent, or Firm*—Carlton H. Hoel; W. James Brady; Richard L. Donaldson

[57] ABSTRACT

An optical-electrical transmitter/receiver (300) with an optical detector (310) for reception which may be made transparent for optical transmission. This permits transmission (320, 330) and reception (310) devices to be positioned in series on a single integrated circuit.

12 Claims, 9 Drawing Sheets

INTEGRATED OPTICAL TRANSMITTER AND RECEIVER

BACKGROUND OF THE INVENTION

The invention relates to optoelectronic devices, and, more particularly, to integrated optoelectronic transmitters and receivers and methods of fabrication.

Optical communication systems have advantages over all electrical communications systems with regard to bandwidth, noise immunity, electromagnetic susceptibility, size, and weight are being extensively developed. An optical source converts input electrical information signals into amplitude modulated light for transmission over an optical communications channel, and an optical detector reconverts the amplitude modulated light into electrical signals for reception. Optical communication systems typically employ semiconductor laser sources, glass optical fiber communication channels, and various modulators and detectors. Optical wavelengths on the order of 1 µm permit use of GaAs-$Al_xGa_{1-x}As$ diode lasers and silicon photodetectors. FIG. 1a heuristically illustrates a one-way communication system with continuous wave laser diode source 102 modulated by Mach-Zehnder interferometer 104 which incorporates phase modulator 106, optical fiber communication channel 108, and photodetector 110. For amplitude-modulated (analog) light signals, continuous wave lasers with following light amplitude modulators, such as the Mach-Zehnder interferometer, are preferred over just directly modulating the input power of the laser because the laser and the modulator may be separately optimized. A full duplex communication system would have a duplicate of the system on FIG. 1a for communication in the opposite direction. Single-optical-fiber two-way communication could use separate optical wavelengths for the two directions, but this would require wavelength filters. Alternatively, the optical fiber could be split, as shown by splitter 112 in FIG. 1b, but this results in a 50% loss in light intensity to detector 110.

Light modulators may be made from numerous materials in various structures and have various modulation effects. In particular, reflection and phase modulators vary the index of refraction of material in a light path, and absorption modulators vary the absorptance of material in the path. Materials such as ferroelectrics, organic polymers, and semiconductors have been used in modulators. Index of refraction modulation can be had from the Pockels effect, plasma effect, band-filling effect, quantum confined Stark effect, magneto-optic effect, and acousto-optic effect; absorption modulation can be had from the Franz-Keldysh effect, quantum confined Stark effect, and Wannier-Stark localization. For example, Weiner et al., Quadratic Electro-optic Effect due to the Quantum-confined Stark Effect in Quantum Wells, 50 Appl.Phys.Lett. 842 (1987). compute change of the index of refraction of a quantum well with a change of applied electric field based on experimentally measured change of absorption. The index of refraction and the absorption are related (Kramers-Kronig relations) due to the causality of electric field induced dielectric polarization. This allows computation of chirp in a quantum well-based absorption modulator. FIGS. 2a–b show quantum well absorption for applied electric fields of 0 and 65000 volts/cm together with the change in index of refraction for perpendicular and parallel polarized light, respectively, as a function of incident photon energy. Note that large absorption changes enable absorption modulator operation and large index or refraction changes enable electro-optic devices such as directional couplers and modulators. Further increases in the electric field across the quantum well spreads out and shifts the absorption peak as illustrated in FIGS. 2c–d, taken from Weiner et al., Strong Polarization-sensitive Electroabsorption in GaAs/AlGaAs Quantum Well Waveguides, 47 Appl. Phys. Lett. 1148 (1985).

Semiconductor lasers in the form of heterojunction diodes with quantum well active regions and made of materials such as $Al_xGa_{1-x}As$ with GaAs quantum wells provide a compact and rugged source of infrared light which can be easily modulated by simply varying the diode current. In particular, a stripe geometry diode laser may be small (e.g., 51 µm wide by 100 µm long with a 30 nm thick active area imbedded in a 400 nm thick optical core). The reflecting ends of the lasing cavity may be distributed Bragg reflectors to avoid cleaved mirror ends. See for example, Tiberio et al., Facetless Bragg Reflector Surface-emitting AlGaAs/GaAs Lasers Fabricated by Electron-beam Lithography and Chemically Assisted Ion-beam Etching, 9 J.Vac.Sci.Tech. B 2842 (1991).

SUMMARY OF THE INVENTION

The present invention provides two-way optical communication with a receiving detector which may be made transparent for transmission. Preferred embodiment integrated circuits include a waveguide with a series combination of a transparentable detector, an amplitude modulator, and a laser source for both reception and transmission.

The present invention provides technical advantages including a detector compatible with same wavelength transmission without a 50% splitting loss.

BRIEF DESCRIPTION OF THE DRAWINGS

The drawings are schematic for clarity.

DESCRIPTION OF THE PREFERRED EMBODIMENTS

Overview

Figure 3:
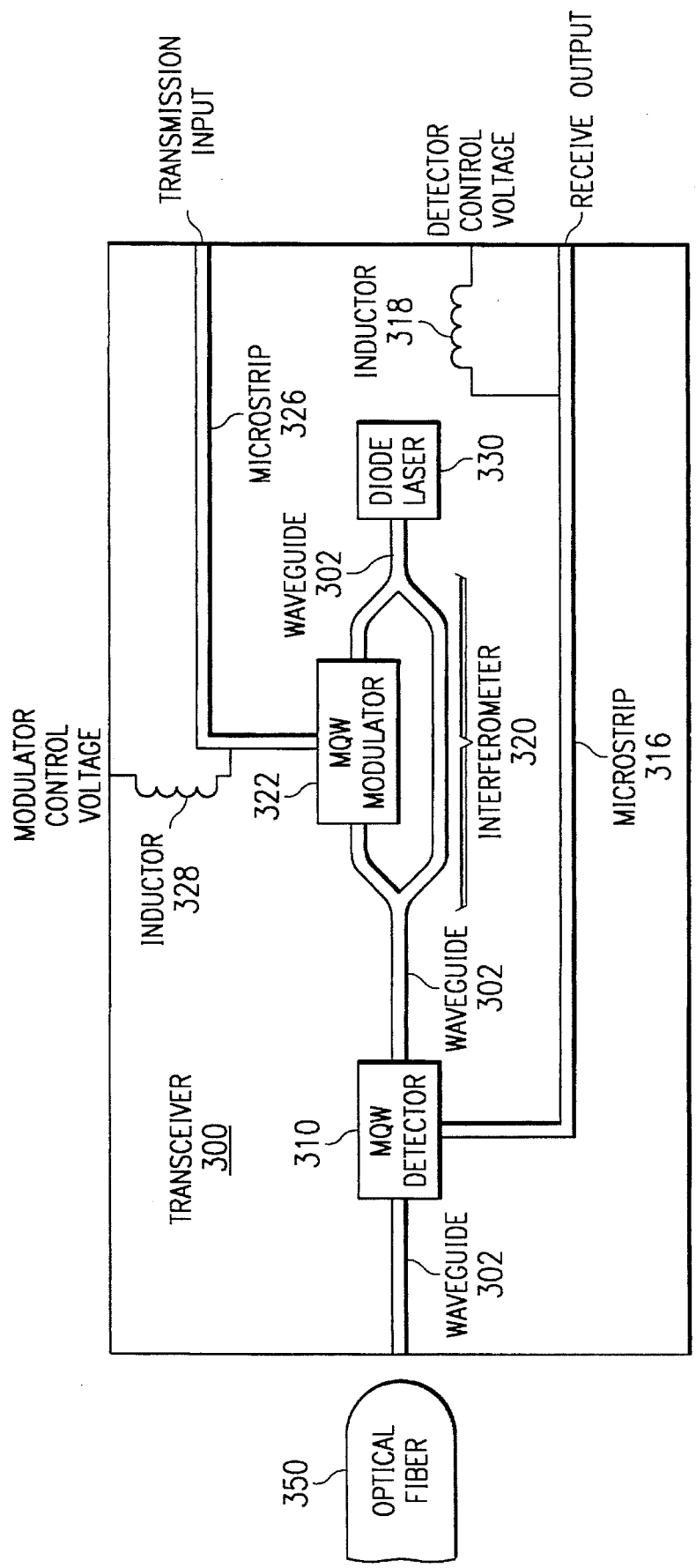
FIG. 3 is a plan view of a first preferred embodiment optical transceiver.

FIG. 3 shows in heuristic plan view first a preferred embodiment optical transceiver integrated circuit, generally indicated by reference numeral 300, including optical waveguide 302 with incorporated multiple quantum well (MQW) optical detector 310, interferometer 320 including phase modulator 322 for amplitude modulation, diode laser 330, dc bias plus output microstrip line 316 with inductor 318 for detector 310, and dc bias plus input microstrip line 326 with inductor 328 for modulator 322. Communication channel optical fiber 350 has a lensed end and butt couples to optical waveguide 302 on integrated circuit 300. Electrical transmit and receive lines connect to microstrips 326 and 316, respectively, and bias (control) lines connect to the detector and modulator through the inductors. Other bias connections, such as resistors, could be used in place of the inductors.

Transceiver 300 operates as follows. To receive information in the form of amplitude modulated (analog) light of a single frequency (single free space wavelength) on optical fiber 350, the dc bias on MQW detector 310 is set so detector 310 is absorbing and laser 330 is turned off. Then the light from optical fiber 350 couples into waveguide 302 at the edge of the integrated circuit and proceeds to detector 310 where it is absorbed and creates an output electrical signal on microstrip 316. Detector 310 basically is a reverse-biased photodiode, so detector 310 outputs a current with amplitude proportional to the amplitude of the input light. The amplitude of the input light has frequencies on the order of MHz to GHz, so inductor 318 prevents coupling of the output current to the dc source, and the output current connects to the receive line.

To transmit information, which is in the form of electrical signals at the transmit line connected to microstrip 326 and with frequencies on the order of MHz to GHz, change the dc bias of detector 310 to make it transparent, turn on laser 330 (which is a continuous wave diode laser), set the dc bias of MQW phase modulator 322, and apply the transmit signal to modulator 322. The light emitted by laser 330 splits into the two branches of waveguide 302 making up interferometer 320, and the light traveling the branch with modulator 322 sees a varying path length because the transmit signal varies the index of refraction of the portion of waveguide 302 within modulator 322. This varying path length implies that the light in the branch with modulator 322 is phase shifted with respect to the light in the other branch, and thus recombining the light from the two branches produces interference and results in amplitude modulation. The amplitude modulated light then passes through transparent detector 310 and out into optical fiber 350. The change of detector 310 from absorbing to transparency by change of the dc bias permits the series connection of detection and transmission on the same waveguide. The following sections describe the components of transceiver 300 in more detail.

Detector

Figure 4A:
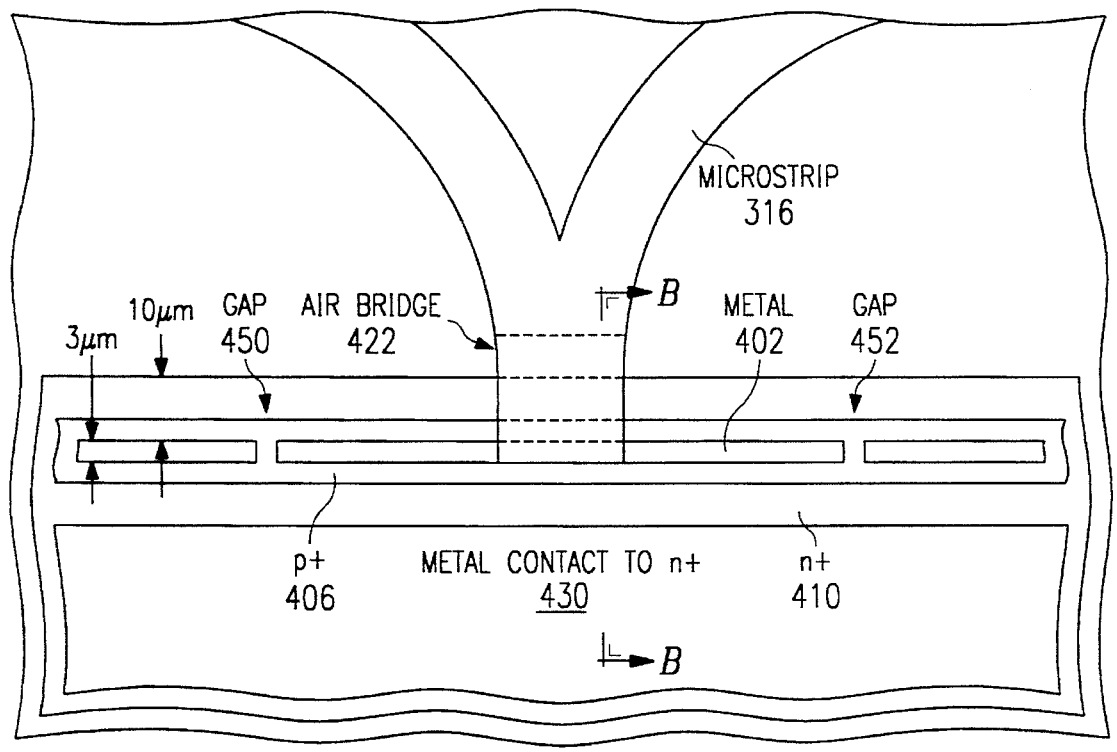
FIGS. 4a–b are plan and cross sectional elevation views of the first preferred embodiment.
Figure 4B:
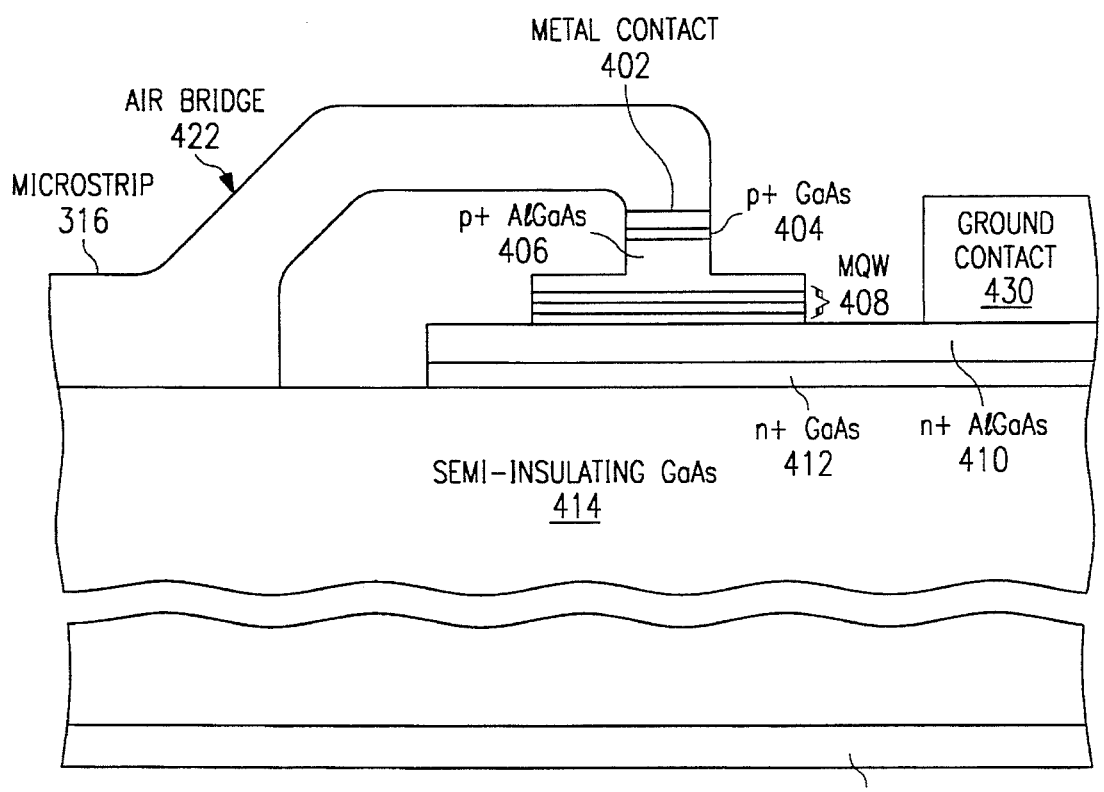
Figure 5:
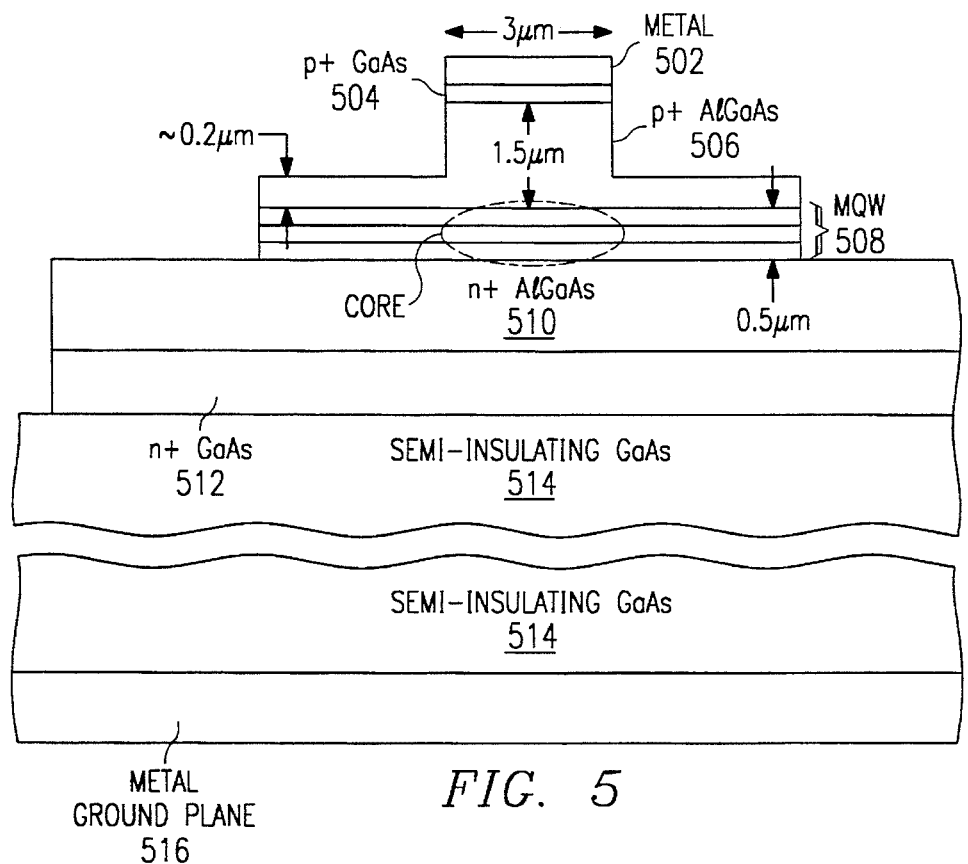
FIG. 5 is a cross sectional elevation view of an integrated circuit waveguide.

FIG. 4a is a plan view of detector 310 and FIG. 4b is a cross sectional elevation view of along section b—b of FIG. 4a. Detector 310 is formed from a portion of waveguide 302 by isolating the metal contact for application of bias voltage and receipt of output signal current. In particular, FIG. 5 shows a cross sectional elevation view of waveguide 302 which consists of 0.1 μm thick metal top contact 502, 0.1 μm thick p+ GaAs contact layer 504, 1.5 μm thick p+ $Al_{0.3}Ga_{0.7}As$ ("AlGaAs") cladding 506, 0.48 μm thick undoped multiple quantum well ("MQW") 508 core, 1.5 μm thick n+AlGaAs 510 cladding, 1 μm thick n+GaAs 512 contact layer, and semi-insulating GaAs substrate 514. Beryllium at $10^9$ atoms/cm$^3$ and $10^8$ atoms/cm$^3$ provides the p+ type doping for the GaAs and AlGaAs, respectively, and silicon at $8\times10^7$ atoms/cm$^3$ and $2\times10^{18}$ atoms/cm$^3$ provides the n+ type doping for the AlGaAs and GaAs, respectively. MQW 508 consists of 37 periods of a 3.5 nm thick GaAs quantum well with a 10 nm thick AlGaAs tunneling barrier. Metal contact 502 is 3 μm wide; and the portion of p+ AlGaAs 506 directly under contact 502 forms a ridge to define the location of the waveguide core. The "shelf" portion of p+ AlGaAs 506 extending beyond contact 502 is roughly 0.2 μm thick.

Figure 6A:
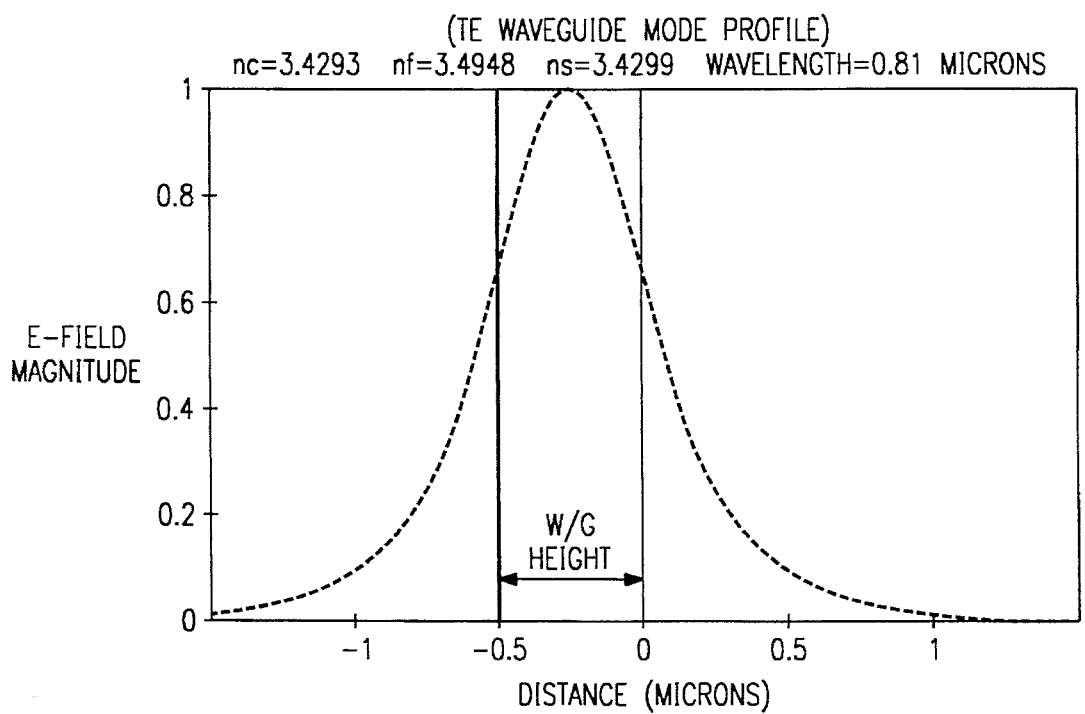
FIGS. 6a–b show optical confinement in the waveguide.
Figure 6B:
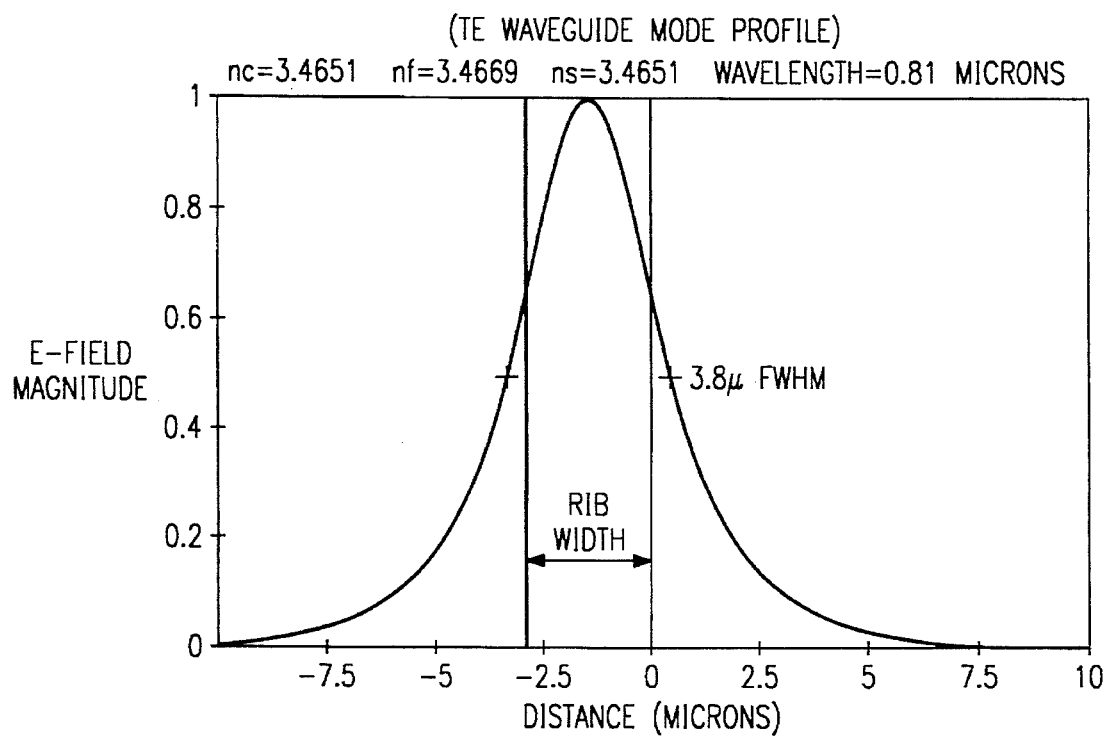

The index of refraction of GaAs (roughly 3.6 for infrared used for communication) is larger than that of AlGaAs (roughly 3.4), so light is confined vertically by the MQW, although significant intensity exists outside of the MQW as illustrated by the electric field density as a function of vertical distance in FIG. 6a. Further, the index of refraction under the AlGaAs ridge structure is greater than the effective index of refraction under the shelf adjacent to the ridge, so the ridge generates lateral confinement of the light and defines a core location. FIG. 6b illustrates the intensity as a function of distance perpendicular from the ridge. The broken line in FIG. 5 suggests a core location about 3 μm wide by 0.5 μm thick. The n+ AlGaAs and n+GaAs connect to ground through vias (not shown in the Figures) to backside metal ground plane 516 on substrate 514. Metal contact 502 also connects to ground for waveguide 302.

Detector 310 is a 300 μm long section of waveguide 302 defined by two gaps 450–452 in metal contact 402 on top of p+ AlGaAs ridge 406 and in the ridge itself. Thus the detector portion of the p+ AlGaAs ridge can be dc biased negative with respect to the n+ cladding to create a reversed biased p-i-n diode for detection capability. Also, topside metal contact 430 to the n+ AlGaAs cladding 410 insures good ground contact. The layer of p+ GaAs 404 on top of the ridge improves ohmic contact to the metal 402, and the n+ contact may be to the n+ GaAs 412 under the n+ AlGaAs cladding 410 to also improve ohmic contact. As FIG. 4a illustrates, air bridge 422 connects metal contact 402 on top of the ridge to microstrip line 316. Microstrip line 316 is in the form of a "V" so that one branch may output the detected signal and the other branch may include a termination network. Air bridge 422, microstrip line 316, and ground contact 430 are electroplated gold and may be several micrometers thick. Microstrip line 316 is separated from backside ground plane 416 by about 500 μm of semi-insulating GaAs substrate 414 and thus has a characteristic impedance of 50 ohms.

Figure 7:
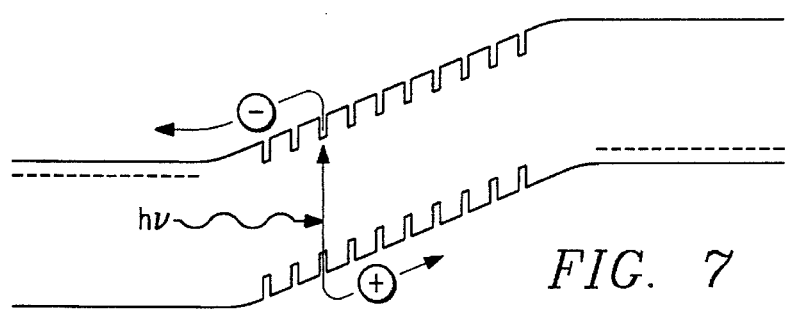
FIGS. 7–8 are band diagrams illustrating absorption and emission.

Application of a negative dc bias voltage of -10 to -12 volts through inductor 318 to microstrip 316 reverse biases the p-i-n diode formed by p+ AlGaAs 406, MQW 408, and n+ AlGaAs 410. The 10 volt drop appears across the undoped MQW and thus creams an electric field of about $2\times10^5$ volts/cm across MQW 408. FIG. 7 shows the band diagram and heuristically illustrates a 1.44 eV photon (free space wavelength of 0.863 μm) being absorbed to create an electron-hole pair with the electron collected in the n+ AlGaAs and the hole collected in the p+ AlGaAs to contribute to the output signal current. The MQW absorption coefficient for photons of energy 1.44 eV when an electric field of $2\times10^5$ volts/cm is applied across the MQW is roughly 3000/cm. Thus detector 310 essentially absorbs 100% of the incident light. The recombination time of the electron-hole pair in the p-i-n diode is very fast, so variations in amplitude of the incoming light up into the GHz range will generate corresponding variations in the output current on microstrip line 316.

Figure 1A:
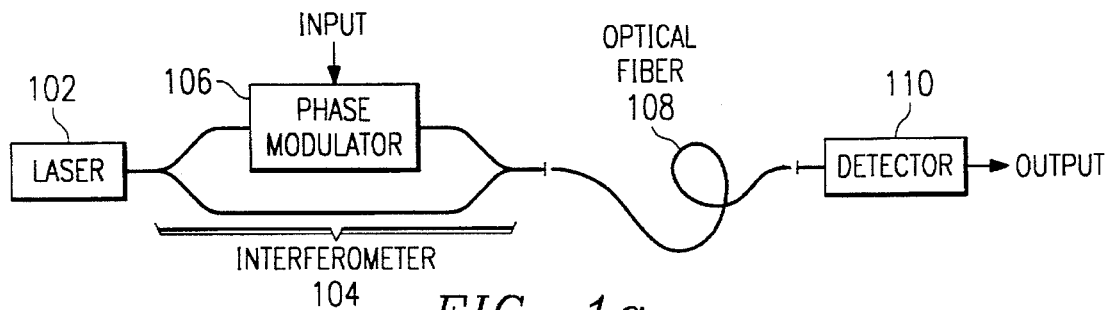
FIG. 1a–b show known optical communication systems.
Figure 1B:
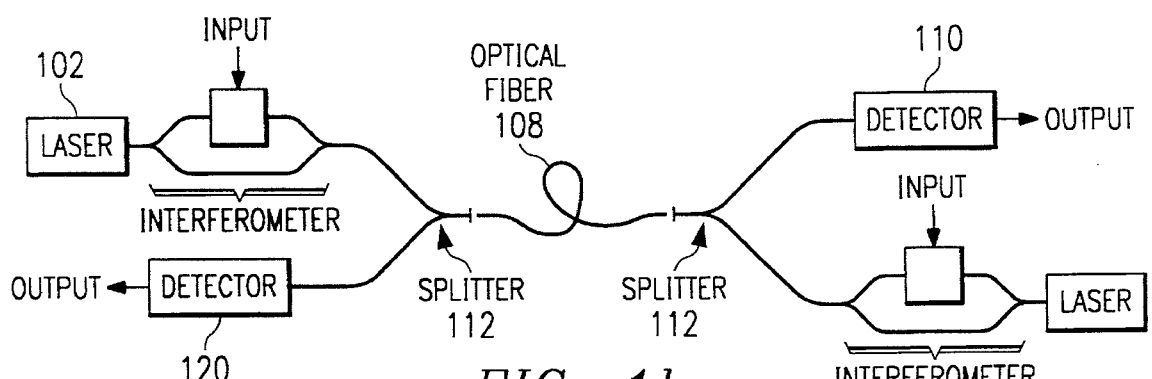
Figure 2A:
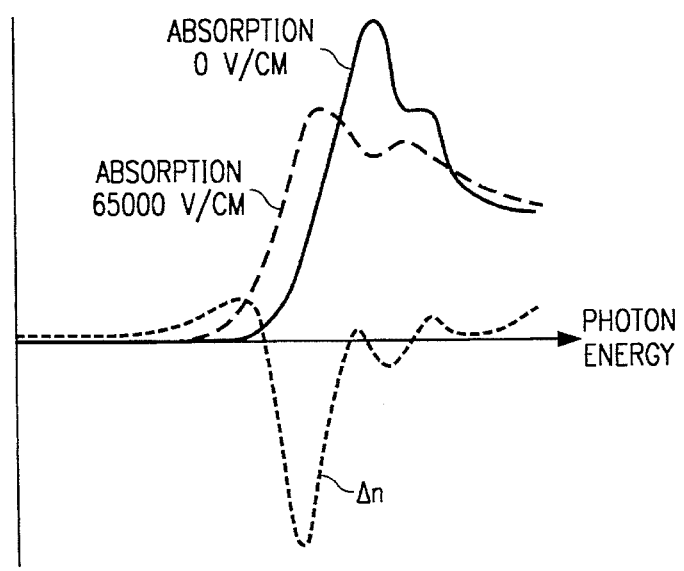
FIGS. 2a–d illustrate quantum well absorption and index of refraction variation.
Figure 2B:
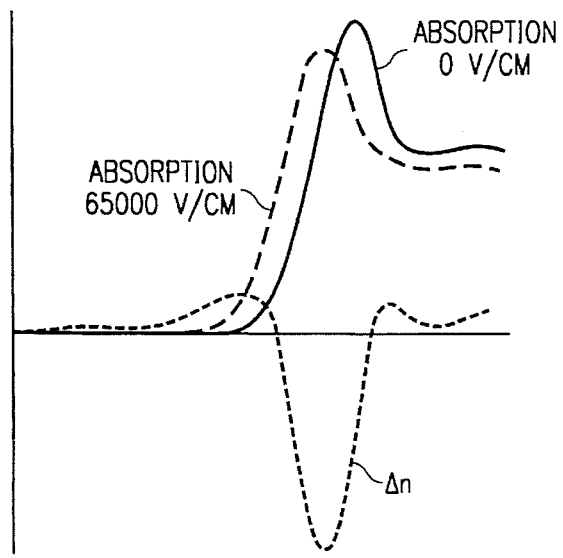
Figure 2C:
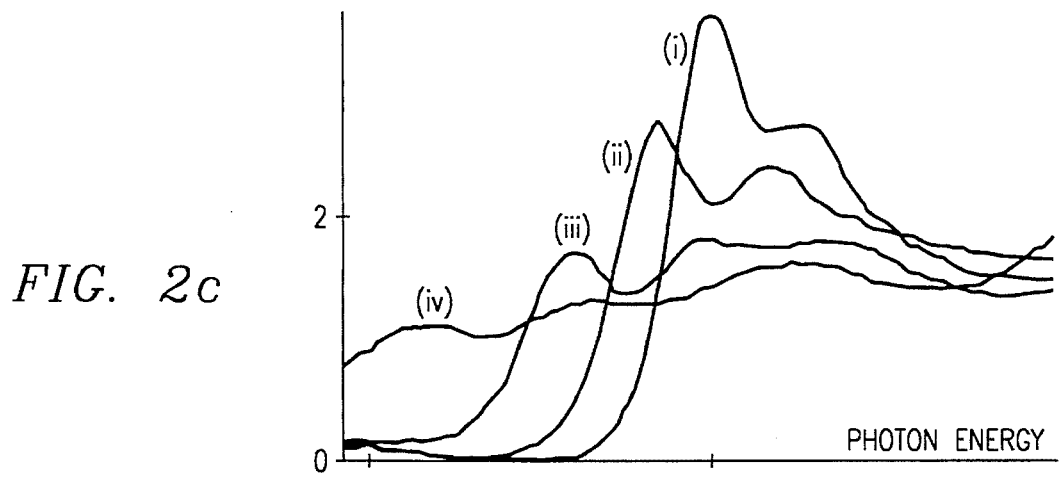
Figure 2D:
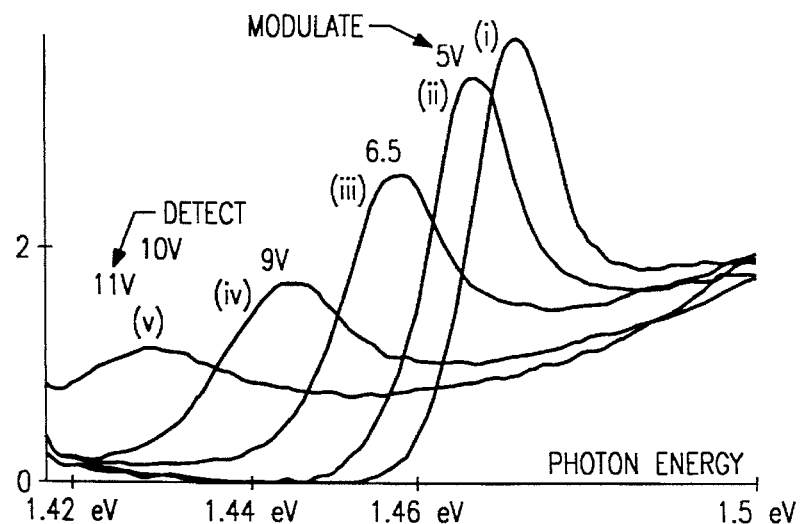

Contrarily, when the electric field is removed, the absorption coefficient for 1.44 eV photons drops to roughly 2/cm, and detector 310 is essentially transparent. This is used for the transmit mode of operation. FIG. 2d shows the absorption curves for various applied electric fields from $1.6\times10^4$ volts/cm to $2.2\times10^5$ volts/cm. For photons with energy about 1.44 eV, the absorption changes drastically with applied electric field.

The connection of microstrip line 316 to detector 310 could have different geometries, such as a travelling wave connection. This would compensate for the highly capacitive nature of detector 310 by introducing inductors with the artificial travelling wave structure and better matching to the 50 ohm microstrip line 316. A backside ground plane on the semi-insulating GaAs substrate connects to the top side metal contacts on n+ GaAs.

Phase modulator

Phase modulator 322 has the same structure as detector 310, but is negatively dc biased at about −5 volts which implies an electric field of about $1\times10^5$ volts/cm across the MQW. This yields a quadratic electro-optic coefficient of about $5\times10^{-20}$ $m^2/V^2$ which implies index of refraction changes on the order of 0.001 for applied signal voltages of a few volts. Thus phase modulator 322 with a length of 500 µm can shift the phase of incident light by up to $\pi$.

Amplitude modulation

Interferometer 320 provides amplitude modulation for the continuous output of diode laser 330 by phase modulator 322 shifting the phase of the light traversing the upper waveguide branch relative to the light traversing the lower branch. Thus the light from upper branch interferes with the light from the lower branch upon recombination to yield an amplitude modulated output from interferometer 320. Each waveguide branch of interferometer 320 has a length of about 2000 µm with phase modulator 322 occupying about 500 µm of the center of the upper branch.

Other approaches to amplitude modulation could also be used. For example, the electrical input signal on microstrip 326 could directly control the current through diode laser 330 and thus the amplitude of the output light, thereby eliminating the interferometer.

Laser

Figure 8:
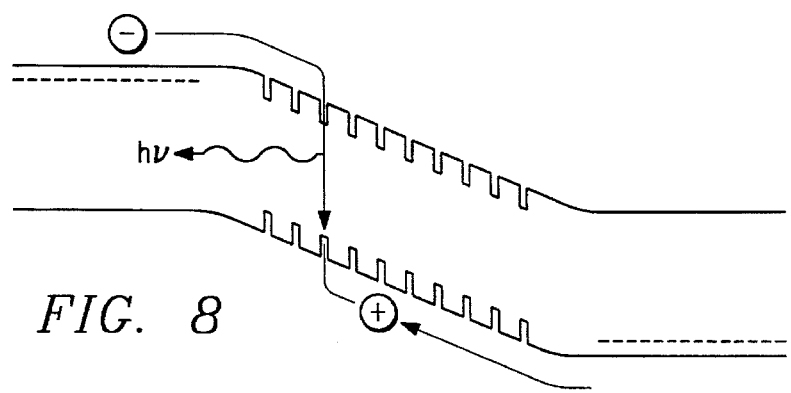
Figure 9:
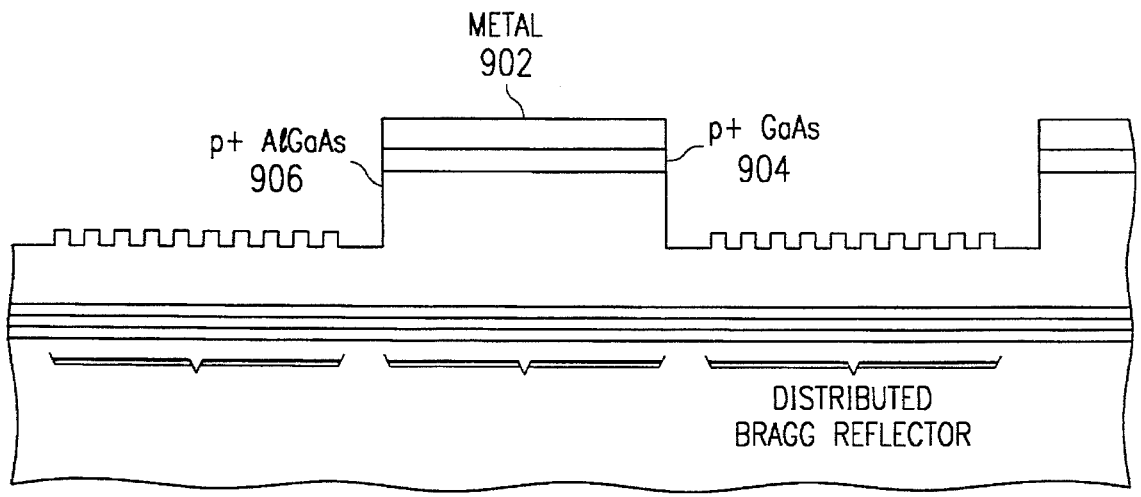
FIG. 9 illustrates a laser with distributed Bragg reflectors and waveguide.

The gain portion of diode laser 330 has the same multiple quantum well structure as detector 310 and phase modulator 322. In contrast to detector 310 and phase modulator 322, diode laser 330 is forward biased to create electron-hole recombination in the quantum wells and thus generation of photons. Stimulated emission leads to lasing when the electron and hole densities are above a threshold. FIG. 8 shows the band diagram; note the analogy to FIG. 7. Rather than having mirror facets, laser 330 uses distributed Bragg reflectors; and the periodicity of the Bragg reflector fingers determines the wavelength (and frequency) of the lasing. A free space wavelength of 0.863 µm translates to a wavelength of roughly 0.24 µm in the core; thus the Bragg reflector fingers have a periodicity on the order of 240 nm. The distributed Bragg reflectors are firmed in the AlGaAs cladding layers as illustrated in cross sectional elevation view in FIG. 9. The Bragg reflectors each has a length of about 500 µm and the gain portion diode has a length of about 500 µm.

Varying the quantum well thickness will move the quantized levels and thereby permit adjustment of the recombination energy and shift the curves of FIGS. 2a–d and thus allow for operation at different wavelengths.

Alternative material systems may be used for the multiple quantum-well common to the detector, phase modulator, and laser and also give different wavelength operation. For example, $PbTe-Pb_{1-x}Sn_xTe$ material systems are well known. Further, there are five strained material systems (both compressive and tensile strain) for various wavelength lasers: (1) $In_xGa_{1-x}As/InAs_yP_{1-y}$, (2) InP, and (3) $Al_xGa_yIn_{1-x-y}As/InP$ for telecommunications (typically infrared from 0.8 to 1.55 µm free space wavelengths, especially at 0.8, 1.3, and 1.55 µm which are popular communications and fiber wavelengths), (4) AlGa(In)As(P)/GaAs for near infrared, and (5) AlGaInP/GaAs for visible light. Also, a CdZnSe quantum well in a ZnSe core with ZnSSe cladding can provide blue-green lasers.

Phased Array

Figure 10A:
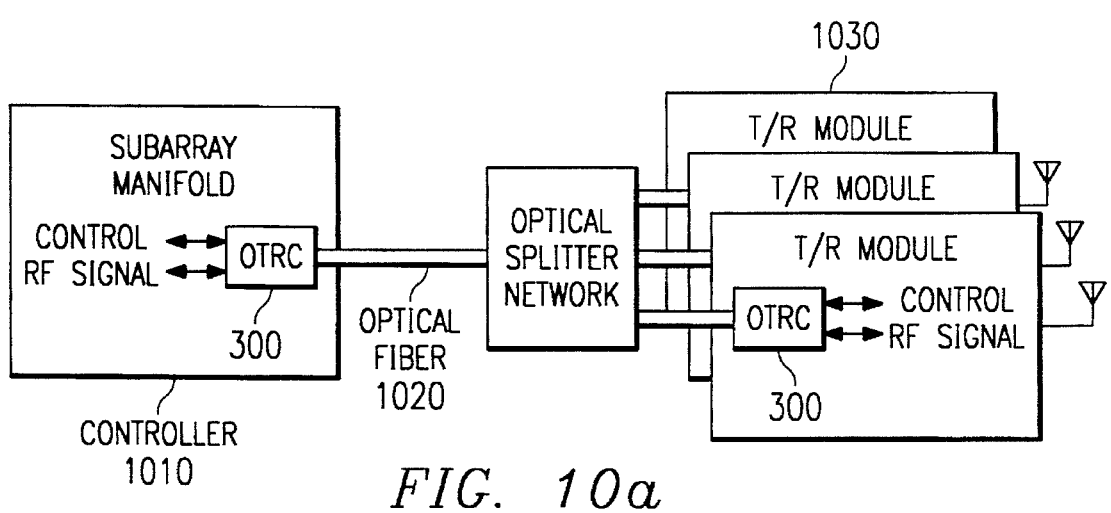
FIGS. 10a–b show preferred embodiment phased array radar systems.

FIG. 10a heuristically shows transceiver 300 used in a phased array radar. Timing signals as well as RF signals may be sent from controller 1010 over optical fiber 1020 to each of the transmit/receive modules 1030 to steer transmitted radar beams, and the received signals sent back on the same optical fiber network. The detectors in the transceivers 300 receive the control signals which drive the power amplifiers powering the antennas. The received radar returns picked up by the antennas are electrically amplified and used to control the phase modulators in the transceivers 300. This transmits the analog received signals back along the optical fiber to the detector in controller 1010. The physical separation of the antennas creates a time separation of the return signals so they appear serially on the optical fiber, multiplexed it time.

Figure 10B:
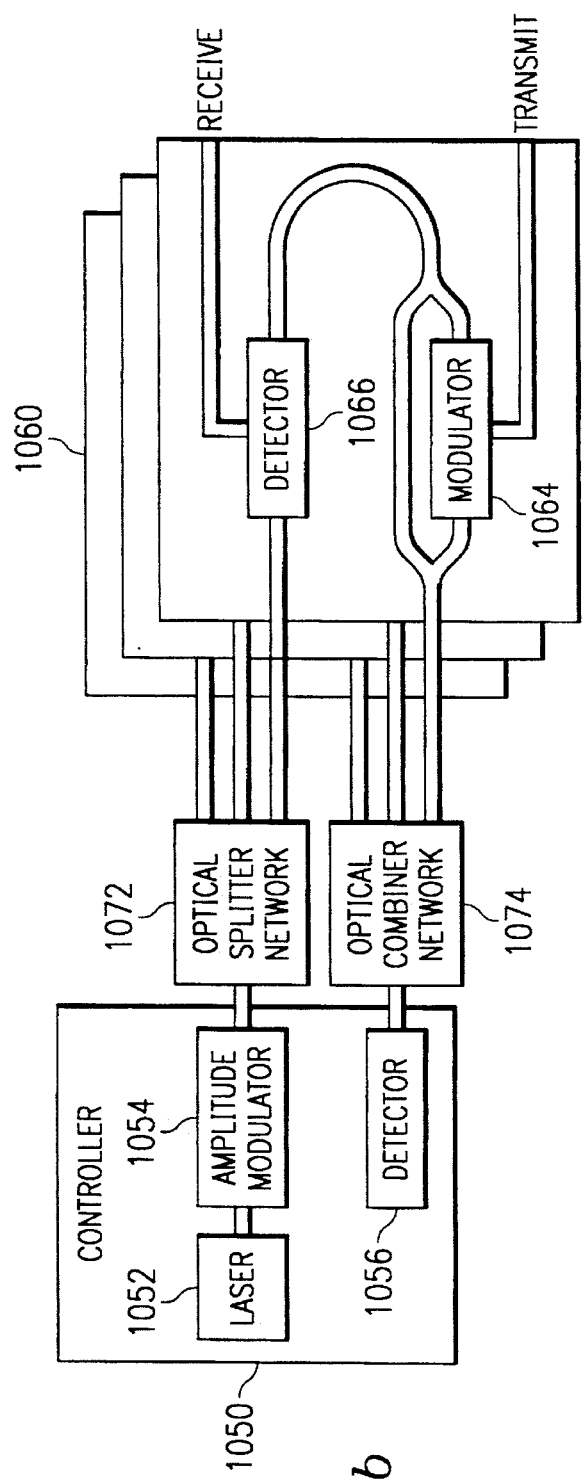

An alternative configuration appears in FIG. 10b and uses two optical fibers to each transceiver 1060. For transmission from controller 1050 to the transceivers 1060 the output of laser 1052 is amplitude modulated by modulator 1054 and the detectors 1066 in the transceivers 1060 convert the amplitude modulation into RF electrical output. Contrarily, for transmission from the transceivers 1060 to the controller 1050, the output of laser 1052 is held constant, modulators 1064 in the transceivers amplitude modulate this light, and detector 1056 in controller 1050 converts the amplitude modulation into electrical signals. In effect optical fiber and splitter 1072 is used for signal transmission from controller 1050 to transceivers 1060 and also for supplying the light for signal transmission from the transceivers to the controller, and optical fiber and combiner 1074 is used for signal transmission from the transceivers to the controller. In effect, the second fiber replaces the on board laser of the transceiver. Thus one large laser supplies all of the transmission light for all of the transceivers in the array, reducing cost and dc power requirements.

Second Preferred Embodiment

Figure 11:
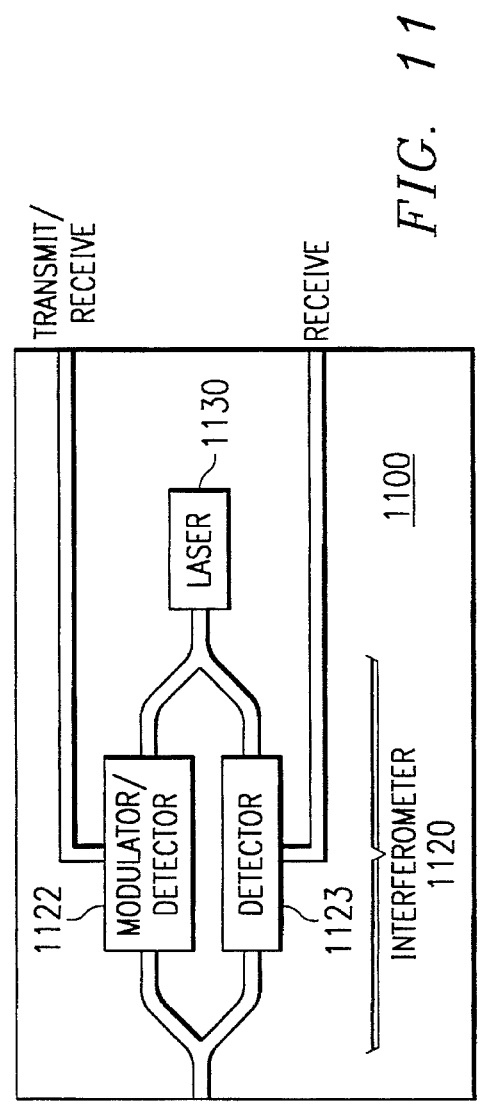
FIG. 11 is a plan view of a second preferred embodiment transceiver.

FIG. 11 illustrates a second preferred embodiment transceiver, generally denoted by reference numeral 1100, in plan view as including interferometer 1120 with modulators 1122 in the upper branch and modulator 1123 in the lower branch and diode laser 1130. For detection, both modulators 1122 and 1123 are dc biased into high absorbing condition, so even though each modulator arm only detects 50% of the incoming light due to the split by the interferometer, the two RF signals are coherently added at the outputs of the modulators and maintain full signal strength.

For transmission, modulator 1123 in the lower branch is transparent and inactive while modulator 1122 in the upper branch is driven by the output signal. Thus the interferometer operates as the interferometer of transceiver 300 for transmission.

Fabrication

FIGS. 12a–f show in cross sectional elevation view steps of a preferred embodiment method of fabrication.

(1) Begin with a semi-insulating GaAs wafer with (100) orientation and 500 μm thickness. Then grow (such as by metalorganic chemical vapor deposition or molecular beam epitaxy) the epitaxial layers as listed in following Table I; note that AlGaAs denotes $Al_xGa_{1-x}As$ for X a fraction such 0.3, and that p type doping is typically with beryllium and n type doping with silicon.

TABLE I

| Layer | Material | Thickness |
|---|---|---|
| Contact | p+ GaAs | 0.1 μm |
| Cladding | p+ AlGaAs | 1.5 μm |
| Spacer | AlGaAs | 100 nm |
| Quantum well | GaAs | 3.5 nm |
| Barrier | AlGaAs | 10 nm |
| Quantum well | GaAs | 3.5 nm |
| Barrier | AlGaAs | 10 nm |
| . | . | . |
| . | . | . |
| . | . | . |
| Quantum well | GaAs | 3.5 nm |
| Barrier | AlGaAs | 10 nm |
| Quantum well | GaAs | 3.5 nm |
| Barrier | AlGaAs | 10 nm |
| Quantum well | GaAs | 3.5 nm |
| Spacer | AlGaAs | 100 nm |
| Cladding | n+ AlGaAs | 1.5 μm |
| Cladding | n+ GaAs | 1 μm |
| Substrate | s.i. GaAs | 500 μm |

The . . . indicate more quantum well-barrier pairs for a total of 37 quantum wells and a total thickness of the multiple quantum well (MQW) structure of 0.5 μm. The spacers keep the dopants out of the quantum wells.

(2) Photolithographically define the locations of the 3-μm wide metal contacts (402, 502,902) on the ridge for the waveguide, detector, phase modulator, and laser plus reflectors; this includes definition of the end gaps. Then deposit the metal contacts by liftoff. The metal may be 300 nm of sputtered Ti, Ni, and Pt. See FIG. 12a.

Figure 12A:
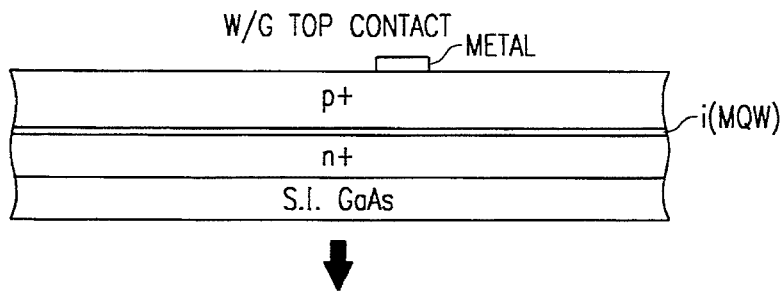
FIGS. 12a–f illustrate steps in a preferred embodiment method of fabrication.
Figure 12B:
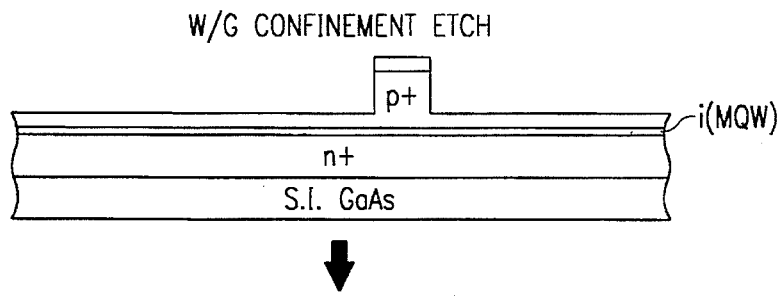
Figure 12C:
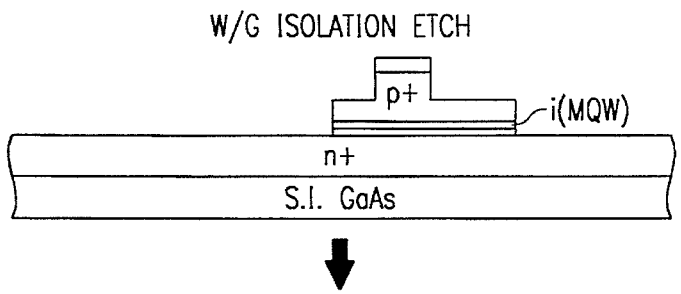
Figure 12D:
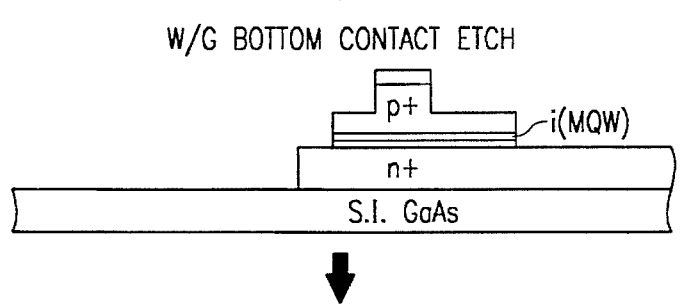
Figure 12E:
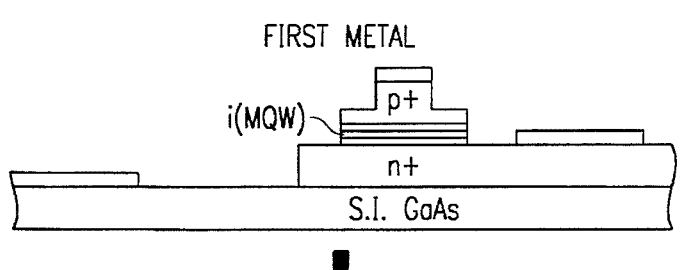
Figure 12F:
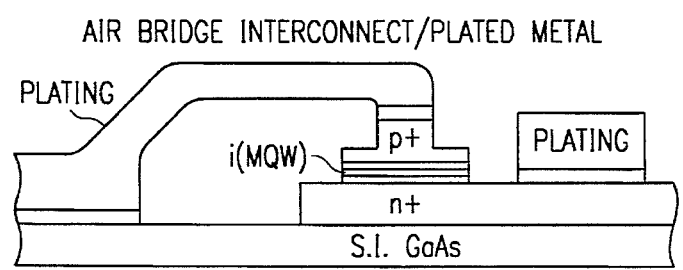

(3) Use the deposited metal contacts as a mask for etching the p+ GaAs and p+ AlGaAs with a plasma of $BCl_3$. The etch is timed to leave about 0.2 μm of p+ AlGaAs over the MQW as shown in FIG. 12b. The length of the end gaps can be increased to increase the resistance between the grounded p+ AlGaAs of the waveguide and the negatively biased p+ AlGaAs of the detector and modulator or positively biased p+ of the laser. Further, a silicon implant can counterdope and decrease the conductivity of the p+ AlGaAs at the end gaps.

(4) Remove the metal contact over the portion of the ridge at either end of the laser to form the distributed Bragg reflectors; this may be performed with a noncritical photoresist mask plus wet metal etch. Then use holographic lithography to define the fingers for the distributed Bragg reflectors on the ends of the laser ridge where the metal contact was removed. Note that the period of the reflectors determines the lasing frequency. In holographic lithography the areas away from the reflectors being defined are masked off and a thin layer of photoresist is applied to the reflector areas; two laser sources are used to create the interference pattern for the exposure of the photoresist. Then the p+ AlGaAs ridge is etch with the holographically patterned photoresist as mask to form the fingers of the reflectors. The depth of the reflector fingers and their distance from the core could be varied: an upper portion of the ridge could be etched away prior to the holographic lithography to move the fingers closer to the core.

(5) Photolithographically define the extension of the MQW laterally from the ridge (about 3–5 μm) and etch down into the n+ AlGaAs with a timed plasma. Continuing the etch down into the n+ GaAs permits the topside ground contact to be to n+ GaAs rather than to n+ AlGaAs. In either case, the depth of the etch is not critical because the thickness of the n+ AlGaAs and n+ GaAs are thick enough. See FIG. 12c.

(6) Photolithographically define the extension of the n+ AlGaAs/GaAs laterally from the ridge (about 10 μm on the microstrip side and enough for the topside contact on the other side) and etch down into the semi-insulating GaAs substrate with a timed plasma. See FIG. 12d which illustrates the n+ extending to the right hand portion of the Figure to accommodate the topside metal ground contact.

(7) Photolithographically define the locations of the microstrip lines and the topside ground contacts. Then deposit metal contacts by liftoff. The metal may be 300 nm of sputtered Ti, Ni, and Pt. See FIG. 12e. Connections from the backside ground plane to the n+ AlGaAs/GaAs are made by a via etched through the semi-insulating substrate prior to the deposition of the ground plane, so the ground metal will line the vias.

(8) Photolithographically define the location for electroplating air bridges and the microstrip lines and topside contacts. Lastly, electroplate gold to form the air bridges and microstrip lines and topside contact; see FIG. 12f.

Modifications and advantages

The preferred embodiments may be varied in many ways while retaining one or more of the features of a detector switchable between transparent and absorbing and an integration of detector and modulator (and laser) for single wavelength two-way optical communication.

For example, the dimensions of the devices and waveguide could be varied, the frequency and wavelength of the light could be varied. Systems of arrays of transceivers other than radar could use the communication. The materials could be changed such as an InP substrate in place of the GaAs substrate, or other GaAs on silicon, or other such.

What is claimed is:

1. An integrated transmitter-receiver, comprising:
   (a) an optical waveguide;
   (b) an optical detector formed in a first portion of said waveguide, said detector switchable between an absorbing state and a transparent state for light of a first frequency; and
   (c) an optical transmitter outputting light at said first frequency formed in a second portion of said waveguide.

2. The transmitter-receiver of claim 1, wherein:
   (a) said waveguide includes a multiple quantum well core.

3. The transmitter-receiver of claim 2, wherein:
   (a) said transmitter includes a laser and an optical amplitude modulator;
   (b) wherein said amplitude modulator includes an interferometer made of two branches of said waveguide with a phase modulator in one of said branches.

4. The transmitter-receiver of claim 3, wherein:

(a) said waveguide has a ridge of p type cladding over said multiple quantum well core and n type cladding under said multiple quantum well core; and (b) each of said detector, phase modulator, and laser includes a portion of said ridge of p type cladding and a portion of said n type cladding.

5. The transmitter-receiver of claim 2, wherein:

(a) said transmitter includes an optical amplitude modulator and an input for contiuous wave light of said first frequency;

(b) wherein said amplitude modulator includes an interferometer made of two branches of said waveguide with a phase modulator in one of said branches.

6. The transmitter-receiver of claim 5, wherein:

(a) said waveguide has a ridge of p type cladding over said multiple quantum well core and n type cladding under said multiple quantum well core; and (b) each of said detector and phase modulator includes a portion of said ridge of p type cladding and a portion of said n type cladding.

7. An optical communication system, comprising:

(a) a first transmitter with output light of a first frequency;

(b) a first optical detector for light of said first frequency;

(c) an optical communication channel with a first end coupled to said first transmitter and to said first detector;

(d) a second optical detector for light of said first frequency and coupled to a second end of said communication channel remote from said first end; and (e) a second optical transmitter with output light at said first frequency and coupled to said second end;

(f) wherein said second detector is switchable between an absorbing state and a transparent state for light of said first frequency.

8. The system of claim 7, wherein:

(a) said communication channel consists of an optical fiber; and (b) said second transmitter includes a laser coupled to an interferometer.

9. The system of claim 7, wherein:

(a) said second detector is between said second end and said second transmitter.

10. The system of claim 7, wherein:

(a) said communication channel consists of first and second optical fibers; and (b) said second transmitter includes an interferometer with said second detector and said interferometer in series between said first and second optical fibers.

11. The system of claim 7, further comprising:

(a) a branch in said communication channel, said branch with a third end;

(b) a third detector for light at said first frequency and coupled to said third end; and (c) a third transmitter with output light at said first frequency and coupled to said third end;

(d) wherein said third detector is switchable between an absorbing state and a transparent state for light at said first frequency.

12. The system of claim 11, wherein:

(a) said communication channel consists of first and second optical fibers, each of said first and second optical fibers with a branch; and (b) said second and third transmitters each includes an interferometer with said second detector and said second transmitter's interferometer in series between said first and second optical fibers and said third detector and said third transmitter's interferometer in series between said first optical fiber's branch and said second optical fiber's branch.

* * * * *